(12) United States Patent
Gupta et al.

(10) Patent No.: US 11,987,187 B2
(45) Date of Patent: May 21, 2024

(54) WORK VEHICLE SYSTEMS INCLUDING MULTILAYER WIRING PANELS

(71) Applicant: Deere & Company, Moline, IL (US)

(72) Inventors: Kunal Gupta, Delhi (IN); Nakib Y. Siddiqui, Pune (IN); Bala Naga Mani Lakshmi Bhavani Gudimetla, Pune (IN)

(73) Assignee: DEERE & COMPANY, Moline, IL (US)

( * ) Notice: Subject to any disclaimer, the term of this patent is extended or adjusted under 35 U.S.C. 154(b) by 621 days.

(21) Appl. No.: 17/183,560

(22) Filed: Feb. 24, 2021

(65) Prior Publication Data

US 2021/0402937 A1    Dec. 30, 2021

(30) Foreign Application Priority Data

Jun. 25, 2020   (IN) .............................. 202021026912

(51) Int. Cl.
*B60R 16/02*       (2006.01)
*B60R 16/03*       (2006.01)
(Continued)

(52) U.S. Cl.
CPC .......... *B60R 16/0215* (2013.01); *B60R 16/03* (2013.01); *H05K 1/0284* (2013.01);
(Continued)

(58) Field of Classification Search
CPC . B60R 16/0215; B60R 16/03; B60R 16/0207; B60R 16/023; B60R 16/0231;
(Continued)

(56) References Cited

U.S. PATENT DOCUMENTS 6,142,556 A * 11/2000 Tanaka ................ B60R 16/0207
                                                        296/146.7
6,299,469 B1   10/2001 Glovatsky et al.
(Continued)

FOREIGN PATENT DOCUMENTS

GB            2283946 A      5/1995

*Primary Examiner* — Jung Kim
(74) *Attorney, Agent, or Firm* — KLINTWORTH & ROZENBLAT IP LLP

(57) ABSTRACT

Work vehicle systems include multilayer wiring panels (MWPs), which provide electrical interconnections to various electronic devices integrated into the work vehicle system. A work vehicle system includes a work vehicle component having a component housing which a first MWP is mounted. The first MWP includes a multilayer panel body having a non-planar cross-sectional shape generally conformal with a topology of a non-planar mounting surface of the component housing, preplaced wires embedded in the multilayer panel body, and panel input/output (I/O) interfaces electrically connected by the preplaced wires. The panel I/O interfaces contain first and second panel I/O interfaces electrically coupled to the controller and to the first integrated electronic device, respectively, such that the controller is placed in signal communication with the first integrated electronic device through the first MWP during operation of the work vehicle system.

19 Claims, 6 Drawing Sheets

(51) Int. Cl.
*H05K 1/02* (2006.01)
*H05K 5/00* (2006.01)

(52) U.S. Cl.
CPC ......... *H05K 1/0298* (2013.01); *H05K 5/0026* (2013.01); *H05K 2201/0129* (2013.01); *H05K 2201/10151* (2013.01)

(58) Field of Classification Search
CPC .............. B60R 16/0232; H05K 1/0284; H05K 1/0298; H05K 5/0026; H05K 2201/0129; H05K 2201/10151; H05K 2201/10287; H05K 3/103; H05K 2201/0999; H05K 5/003
See application file for complete search history.

(56) References Cited

U.S. PATENT DOCUMENTS

| | | |
|---|---|---|
| 8,835,768 B2 | 9/2014 | Sekine |
| 9,019,722 B2 | 4/2015 | Parry-Jones et al. |
| 2015/0100187 A1 | 4/2015 | Light et al. |
| 2016/0325699 A1 | 11/2016 | Yoshida et al. |

\* cited by examiner

WORK VEHICLE SYSTEMS INCLUDING MULTILAYER WIRING PANELS

CROSS-REFERENCE TO RELATED APPLICATION(S)

This application claims priority under 35 U.S.C. § 119(a) to India application Ser. No. 2020/21026912, filed Jun. 25, 2020.

STATEMENT OF FEDERALLY SPONSORED RESEARCH OR DEVELOPMENT

Not applicable.

FIELD OF THE DISCLOSURE

This disclosure relates to embodiments of work vehicle systems including multilayer wiring panels, which provide electrical interconnections to various electronic devices integrated into the work vehicle system.

BACKGROUND OF THE DISCLOSURE

Work vehicles are complex machines containing various electronic components, which are conventionally electrically interconnected utilizing numerous wires or cables bundled as wiring harnesses. Such wiring harnesses may be utilized to interconnect operator input devices (e.g., joystick devices), display devices, and other components within the operator station of a work vehicle of the type utilized in the agriculture, forestry, mining, or construction industry. Similarly, wiring harnesses are commonly utilized to interconnect the various electronic devices integrated into work vehicle engine systems or powertrains. In this latter regard, one or more wiring harnesses may be routed about the exterior of a work vehicle engine and affixed thereto at various locations. The wires within the wiring harness branch from the main harness body to connect to externally-accessible input/output interfaces for sensors, actuators, and similar electronic devices integrated into the engine. Such electrical interconnections allow power routing to the integrated electronic devices, while further providing signal communication between the electronic devices and an external controller, such an Engine Control Unit (ECU), onboard the work vehicle. To ensure that such wiring harnesses remain securely fastened to the work vehicle engine, particularly given the thermal extremes and high vibratory forces often encountered within the engine compartment of a work vehicle, the wiring harness may be affixed to a work vehicle engine at several locations utilizing mounting hardware. Such mounting hardware may include clamps, brackets, and similar structure, which are bolted or otherwise fastened to mounting features formed in the outer walls of engine block, the header assembly, or other sections of the work vehicle engine.

SUMMARY OF THE DISCLOSURE

Work vehicle system including multilayer wiring panels (MWPs) are disclosed. In embodiments, the work vehicle system includes a controller, a work vehicle component, and a first MWP. The work vehicle component includes, in turn, a component housing having a non-planar mounting surface, as well as a first integrated electronic device at least partially contained in the component housing. The first MWP is mounted to the work vehicle component and positioned over the non-planar mounting surface. The first MWP includes a multilayer panel body having a non-planar cross-sectional shape generally conformal with a topology of the non-planar mounting surface, preplaced wires embedded in the multilayer panel body, and panel input/output (I/O) interfaces electrically connected by the preplaced wires. The panel I/O interfaces contain first and second panel I/O interfaces electrically coupled to the controller and to the first integrated electronic device, respectively, such that the controller is placed in signal communication with the first integrated electronic device through the first MWP during operation of the work vehicle system.

MWPs installable within a work vehicle system, which includes a controller and a work vehicle component containing at least one integrated electronic device, are further disclosed. In embodiments, the MWP includes a multilayer panel body configured to be mounted to a non-planar mounting surface of the work vehicle component when the MWP is installed within the work vehicle system. The multilayer panel body has a non-planar cross-sectional shape generally conformal with a topology of the non-planar mounting surface. Preplaced wires are embedded in the multilayer panel body, which electrically interconnect panel input/output (I/O) interfaces of the MWP. The panel I/O interfaces include first and second panel I/O interfaces configured to be electrically coupled to the controller and to the integrated electronic device, respectively, to place the controller in signal communication with the first integrated electronic device through the preplaced wires when the first MWP is installed within the work vehicle system.

The details of one or more embodiments are set-forth in the accompanying drawings and the description below. Other features and advantages will become apparent from the description, the drawings, and the claims.

BRIEF DESCRIPTION OF THE DRAWINGS

At least one example of the present disclosure will hereinafter be described in conjunction with the following figures.

Figure 1:
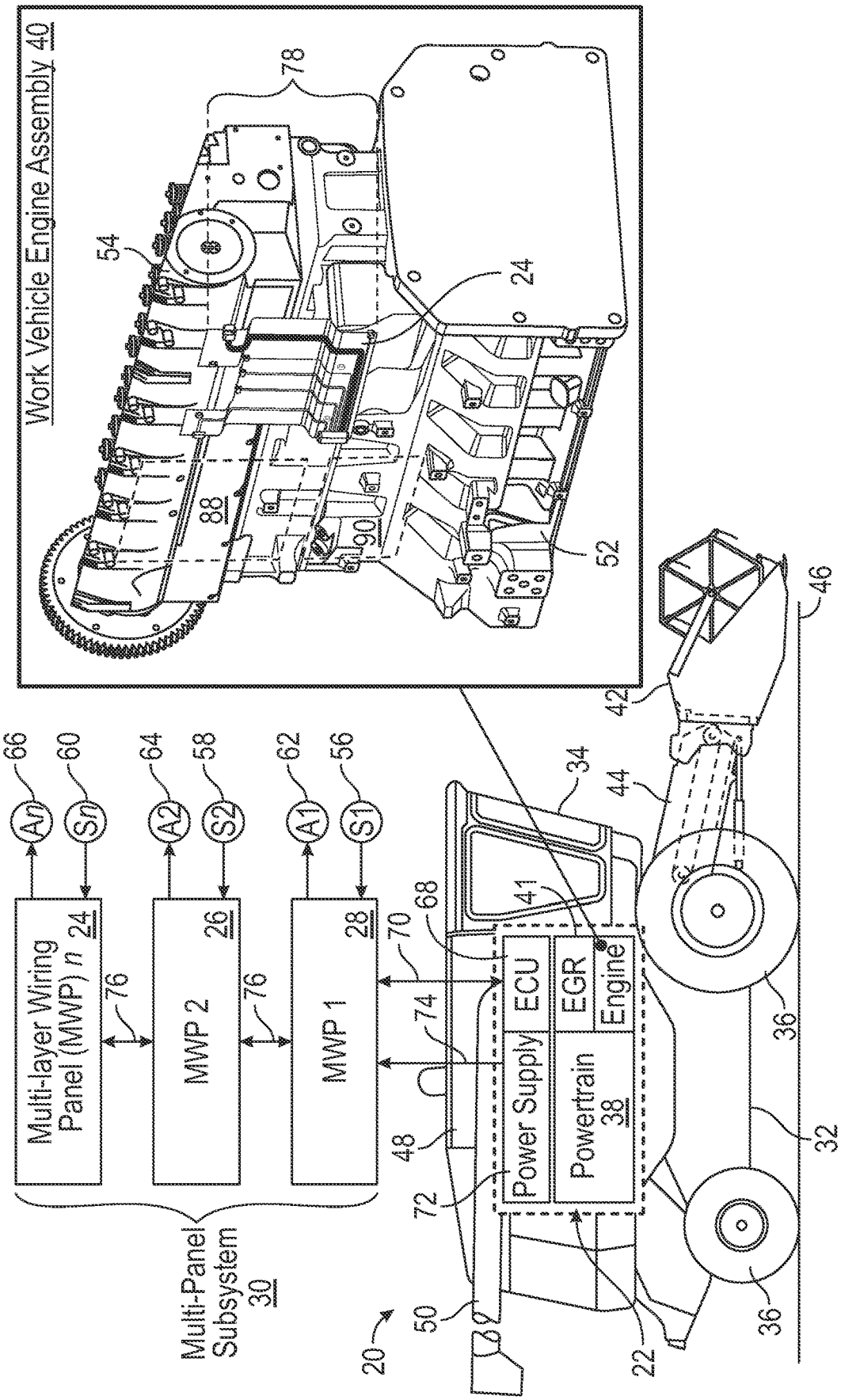
FIG. 1 schematically illustrates a work vehicle system onboard a work vehicle (here, a work vehicle engine system onboard a combine harvester) including multiple multilayer wiring panels (MWPs) interconnected to form a multi-panel subsystem, as illustrated in accordance with an example embodiment of the present disclosure.

Like reference symbols in the various drawings indicate like elements. For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

Overview

As noted above, wiring harnesses are commonly utilized within work vehicles to provide signal and power routing to various electronic devices integrated into work vehicle systems. In areas of high wire routing density, wiring harnesses can become relatively large and unwieldy, particularly in instances in which individual wires or small sets of wires are mounted utilizing separate clamps, brackets, tie bands, fasteners, and similar hardware. Wiring harness-related difficulties are also encountered in the context of work vehicle engine environments due to the high vibratory forces and thermal extremes occurring in regions immediately adjacent the work vehicle engine assembly; e.g., adjacent the engine block, header, and possibly other neighboring components (e.g., an exhaust gas recirculation (EGR) subsystem) supporting engine operation. In the context of such harsh environments, wiring harness failure modes can occur due to the gradual abrasion of wires, the loosening of fasteners, and similar issues occurring over time in the presence of sustained vibrations and aggressive thermal cycling. Such issues can be alleviated, within limits, by furnishing a work vehicle engine assembly with a relatively large number of wiring harness mount points and by utilizing a correspondingly large number of fastening devices to secure a wiring harness about the exterior of the work vehicle engine assembly. Such solutions are less than ideal, however, and add considerable complexity, part count, and routing constraints to the resulting system. Further, the usage of relatively complex wiring harnesses, associated hardware, and a high number of engine mount points adds undesired duration and complexity to the manufacturing process. Other issues, such as warranty concerns, are also exacerbated with increasing wire harness complexity.

An ongoing demand thus persists for work vehicle interconnection solutions reducing reliance on complex wiring harness arrangements of the type utilized to traditionally interconnect (provide power routing to and signal communication with) electronic devices integrated into work vehicle systems. In satisfaction of this demand, the following describes unique interconnect devices or structures, referred to herein as "multilayer wiring panels" or "MWPs", which streamline interconnection architectures within work vehicle systems. Such MWPs are particularly well-suited for establishing electrical interconnections in regions of high wiring densities, while reducing reliance on complex wiring harness designs and routing schemes. A given MWP may be fabricated to have a relatively low profile (panel-like) three dimension (3D) geometry, which is substantially conformal with (generally follows) an external non-planar topology of the work vehicle component to which the MWP is mounted; herein, a "non-planar MWP mounting surface" or "non-planar mounting surface." For example, in the case of a work vehicle engine assembly, the MWP may be molded or otherwise produced to have a relatively thin-walled shape, which follows the outer contours of an exterior surface of the engine block and/or header to which the MWP is mounted. In such embodiments, the MWP may occupy a relatively small spatial volume, while remaining closely conformal with the MWP mounting surface to readily satisfy packing constraints. Concurrently, a given MWP can be mounted to its corresponding non-planar mounting surface utilizing a relatively small number of bolts or other fasteners in embodiments to further reduce part count and complexity, while minimizing the number of fastener interfaces (e.g., threaded bores) formed in the non-planar MWP mounting surface.

Embodiments of a given MWP contain discretely-placed segments of wire embedded in a multilayer panel body. Such wires are referred to herein as "preplaced wires"; the term "preplaced wires," as appearing herein, referring to wires (single strand or multi-strand conductors) obtained as discrete prefabricated components, which are embedded in the multilayer panel body during panel fabrication. Such preplaced wires should thus be distinguished from other electrical conductors, such as metal traces, which are formed by patterning deposited metal layers, utilizing an electroplating process, or otherwise produced during fabrication of a printed wiring board, a molded interconnect device, or a similar structure. Generally, in embodiments, the preplaced wires may each have circular cross-sectional shape and a gauge similar or identical to the wire gauges typically utilized in conventional work vehicle wiring harnesses; noting that such wire gauges may depending upon the purpose of the wire (whether for signal communication or power routing) and the electrical parameters (e.g., operating voltage range) of the work vehicle under consideration. In at least some embodiments, the preplaced wires may each have a wire diameter equal to or greater than 1 millimeter (mm). In other instances, the preplaced wires may each have an American wire gauge (AWG) ranging from about 18 (a diameter of 1.02 mm) to about 12 (a diameter of 2.06 mm). Again, different wire sizes may be utilized depending upon the work vehicle at issue and whether a particular wire is utilized for electrical power conduction or signal transmission purposes. The preplaced wires may be bare single conductor (single strand) or multi-conductor (multi-strand) wires in embodiments, with the multilayer panel body composed of dielectric materials providing the desired electrical isolation between different wires. The preplaced wires can be predominately composed of a single alloy in embodiments; can contain a metallic core having a first composition surrounded by an outer cladding having a second metallic composition; or can have any other construction suitable for conducting electrical power and signals as described herein.

Different methods can be utilized to fabricate the below-described MWPs. In one fabrication approach, the preplaced wires are arranged in a desired routing pattern or "wiring layout," which is captured between a dielectric laminate structure (here, the multilayer panel body) containing at least two laminate layers. The laminate layers can be formed of any moldable dielectric material or materials suitable for retaining the wires in their desired positions, assuming and retaining the desired 3D panel shape, and possessing temperature and mechanical tolerances suitable for the local environment into which the MWP is desirably inserted. Accordingly, in the case of an MWP bolted or otherwise attached to a mounting surface provided on a work vehicle engine assembly, the MWP laminate layers are desirably formed from a material having relatively high temperature tolerances and capable of withstanding repeated thermal cycling and vibration forces without crack formation, propagation, and failure. A non-exhaustive list of suitable candidate materials includes polydicyclopentadiene (PDCPD), acetal (polyoxymethylene), polysulfone, polyimide-based plastics, polypropylene, and other high performance thermosetting polymers (also referred to herein as "thermoplastics"). Such thermosetting polymers may also be loaded with fillers in embodiments, such as carbon fibers, for added strength or to enhance other properties (e.g., the heat dissipation characteristics) of the MWP. In other embodiments, a different fabrication technique can be utilized to produce the MWPs, such as a technique in which an additive manufacture process is utilized to initially produce a base panel layer having furrows, open trenches, or other cavity features for receiving and positioning the preplaced wires in the desired wire layout. After positioning of the preplaced wires, an additional layer is then bonded over the preplaced wires and the base substrate to form multilayer panel body, thereby securing the wires in their desired positions.

Embodiments of the work vehicle systems described herein may beneficially incorporate multiple MWPs, which are electrically interconnected to form a multi-panel subsystem. In this case, each MWP may enable power supply to and signal communication with electronic devices integrated into different regions of a particular component, such as a work vehicle engine assembly, with power and signal routing often passing through multiple MWPs. Interconnections between adjacent MWPs may be provided by relatively short, flexible connector cables in embodiments, with the connector ends of the connector cables mating (e.g., plugging into) corresponding ports provided about a given MWP. In this manner, the MWP may be deployed adjacent the regions of a work component containing a greater density of electronic devices, while minimizing MWP size and providing a relatively high level of modularity; e.g., in embodiments, a particular MWP within a subsystem may be utilized across multiple work vehicle platforms, while other MWPs within the multi-panel subsystem may be adapted for usage exclusively with particular work vehicle platform or component (e.g., engine) type. Repair and maintenance may also be facilitated by allowing the replacement of a single MWP or a subset of MWPs as appropriate. The end result is a work vehicle system having a simplified interconnection architecture implemented utilizing any practical number of MWPs, which reduces reliance on complex wiring harness arrangements, improves overall electrical reliability, provides space savings, simplifies assembly during manufacture, and facilitates in-field repair and maintenance procedures.

Embodiments of work vehicle systems containing MWPs will now be described in conjunction with FIGS. 1-9, with example methods of manufacturing such MWPs discussed below in connection with FIGS. 5-9. In the following examples, the MWPs are principally described as utilized within a specific type of work vehicle system (a work vehicle engine system), which is deployed onboard a specific type of work vehicle (a combine harvester). In further embodiments, however, the below-described MWPs and variants thereof can be integrated into other types of work vehicle systems, such as work vehicle systems having relatively high wire routing densities or otherwise traditionally reliant on relatively complex wiring harness interconnections; e.g., operator interface systems containing multiple operator input devices (e.g., joysticks or control levers), display devices, and similar electronic components commonly located onboard work vehicles. Further, embodiments of the MWPs can be integrated into various different types of work vehicles employed within the agricultural, construction, forestry, and mining industries. Accordingly, the following description should be understood as merely establishing a non-limiting context in which embodiments of the present disclosure may be better understood.

Example Work Vehicle System Containing Multilayer Wiring Panels

Turning now to the drawings and referring initially to FIG. 1, there is shown a combine harvester 20 containing a work vehicle engine system 22 including three MWPs 24, 26, 28, as illustrated in accordance with an example embodiment of the present disclosure. The MWPs 24, 26, 28 are electrically interconnected to collectively form a multi-panel subsystem 30, as indicated in the upper left of FIG. 1. The MWPs 24, 26, 28 and the multi-panel subsystem 30 are described more fully below in connection with FIGS. 2-5. First, however, additional description of the combine harvester 20 is provided to establish an example context in which embodiments of the present disclosure may be better understood.

In addition to the work vehicle engine system 22, the combine harvester 20 includes a body or chassis 32, a cabin 34 located at or adjacent a forward portion of the chassis 32, and an operator station enclosed by the cabin 34. The harvester chassis 32 is supported by a number of ground-engaging wheels 36. The wheels 36 of the work harvester chassis 32 are driven through a powertrain 38 including a work vehicle engine assembly 40, an example of which is illustrated in greater detail in an upper right region of FIG. 1. A standard header or grain platform 42 is mounted to a feederhouse 44, which projects from the leading end of the combine harvester 20 in a forward direction. As the combine harvester 20 travels over a field 46, crop plants are severed by the grain platform 42, taken into the feederhouse 44, and processed in subsequent sections of the harvester 20. Clean grain is delivered via a to a clean grain tank 48 via non-illustrated clean grain elevator contained within a central portion of the combine harvester 20. The clean grain collected within the clean grain tank 48 can be offloaded from the combine harvester 20, perhaps while the combine harvester continues to travel over the field 46 in a forward direction, utilizing an unloading auger 50.

In the example of FIG. 1, the work vehicle engine assembly 40 assumes the form of a diesel engine including an engine block 52 and a header assembly 54. The work vehicle engine assembly 40 may also include various other components or subsystems in further embodiments. For example, as generically shown in FIG. 1, the work vehicle engine assembly 40 may assume the form of a heavy-duty diesel engine including an Exhaust Gas Recirculation (EGR) subsystem 41 for emissions control. Generally, the form assumed by the work vehicle engine assembly 40 will vary depending upon the particular type of work vehicle within which the work vehicle engine assembly 40 is installed. Regardless of its particular form, the work vehicle engine assembly 40 contains various electronic components, including one or more sensors 56, 58, 60 and one or more actuators 62, 64, 66, integrated into the work vehicle engine assembly 40. The sensors 56, 58, 60 and the actuators 62, 64, 66 (collectively, the "integrated electronic devices 56, 58, 60, 62, 64, 66") are schematically shown in an upper portion of FIG. 1 for clarity; however, it will be appreciated that such devices are integrated into the work vehicle engine assembly 40 and thus generally cannot be seen from the exterior of the engine assembly 40. A non-exhaustive list of the sensors 56, 58, 60 suitably integrated into the work vehicle engine assembly 40 in embodiments includes oxygen sensors, mass air flow sensors, knock sensors, throttle position sensors, and temperature sensors. In embodiments in which the work vehicle engine assembly 40 includes the EGR subsystem 41, the sensors 56, 58, 60 may also include one or more chemical (e.g., nitrous oxide) sensors. Comparatively, actuators 62, 64, 66 can include actuators regulating air intake flow (e.g., a throttle valve actuator) and possibly combustive fuel metering within the engine assembly 40. Additionally, when the engine assembly 40 is equipped with the EGR subsystem 41, the actuators 62, 64, 66 may include an exhaust throttle valve actuator for modulating a throttle valve to regulate cooled exhaust gas recirculation to the intake manifold of the engine assembly 40.

An ECU 68 communicates with the integrated electronic devices 56, 58, 60, 62, 64, 66 through the multi-panel subsystem 30 and possibly other electronic connections (e.g., non-illustrated cable connectors or simplified wiring harnesses), as further indicated in FIG. 1 by double-headed arrow 70. Similarly, electrical power is provided to the integrated electronic devices 56, 58, 60, 62, 64, 66 from a power supply 72, such as a work vehicle battery, through the multi-panel subsystem 30 and any associated electrical connectors, as indicated by arrow 74. Such a power supply 72 may or may not be routed through the ECU 68 prior to delivery to the multi-panel subsystem 30. As further indicated by arrows 76, the MWPs 24, 26, 28 included within the multi-panel subsystem 30 are electrically interconnected, with each MWP 24, 26, 28 providing interconnection to different ones of the integrated electronic devices 56, 58, 60, 62, 64, 66. For example, as schematically depicted, the MWP 28 may provide signal communication with and power supply to one or more sensors 56 and/or one or more actuators 62 integrated into the work vehicle engine assembly 40; the MWP 26 may provide signal communication with and power supply to one or more sensors 58 and/or one or more actuators 64 integrated into the engine assembly 40; and the MWP 24 may provide signal communication with and power supply to one or more sensors 60 and/or one or more actuators 66 integrated into the engine assembly 40. Thus, in various implementations, the ECU 68 may be electrically coupled to sensors, actuators, and other such integrated devices contained in the work vehicle engine assembly 40 (and, perhaps, specifically contained in a subsystem of the engine assembly 40, such as a sensor or actuator contained in the EGR subsystem 41) through any combination of the MWPs 24, 26, 28.

In embodiments, the power supply and signal transmission paths of the work vehicle engine system 22 may be routed through multiple ones of the interconnected MWPs 24, 26, 28 for certain integrated electronic devices, depending upon the manner in which the MWPs 24, 26, 28 are electrically interconnected with each other, with the ECU 68, and with the power supply 72. As a specific example, electrical power, as transmitted from the power supply 72 and to the sensor(s) 60 and the actuator(s) 66 electrically connected to the MWP 24, is initially routed through one or more intervening (e.g., the MWPs 26, 28) in the illustrated example. Similarly, the output signals transmitted from the ECU 68 to the actuator(s) 66 and the input signals transmitted from the sensor(s) 60 to the ECU 68 may be routed through MWPs 26, 28, as shown. In other implementations, a different routing scheme may be employed, the multi-panel subsystem 30 may contain a different number of MWPs, and/or any given MWP included in the multi-panel subsystem 30 may provide interconnection exclusively to one or more sensors, to one or more actuators, or to other electronic devices integrated into the work vehicle engine assembly 40.

The MWPs 24, 26, 28 may be mounted to different exterior portions of the work vehicle engine assembly 40 (or another work vehicle component in other instances of the work vehicle system) and electrically interconnected in any suitable manner. An example of one manner in which MWP 24 may be mounted to an exterior region or "MWP mounting surface 78" of work vehicle engine assembly 40 is shown in the upper right of FIG. 1. When the MWP mounting surface 78 has a non-planar topology characterized by raised protrusions, steps, recesses, or other such 3D topological features, the MWP mounting surface 78 may be referred to as the "non-planar MWP mounting surface 78" or, more simply, the "non-planar mounting surface 78." As described more fully below, the MWPs 24, 26, 28 each included a multilayer panel body, some or all of which may be fabricated to have a non-planar cross-sectional shape generally conformal with a topology of the non-planar mounting surface over or against which a given MWP 24, 26, 28 is installed.

Figure 2:
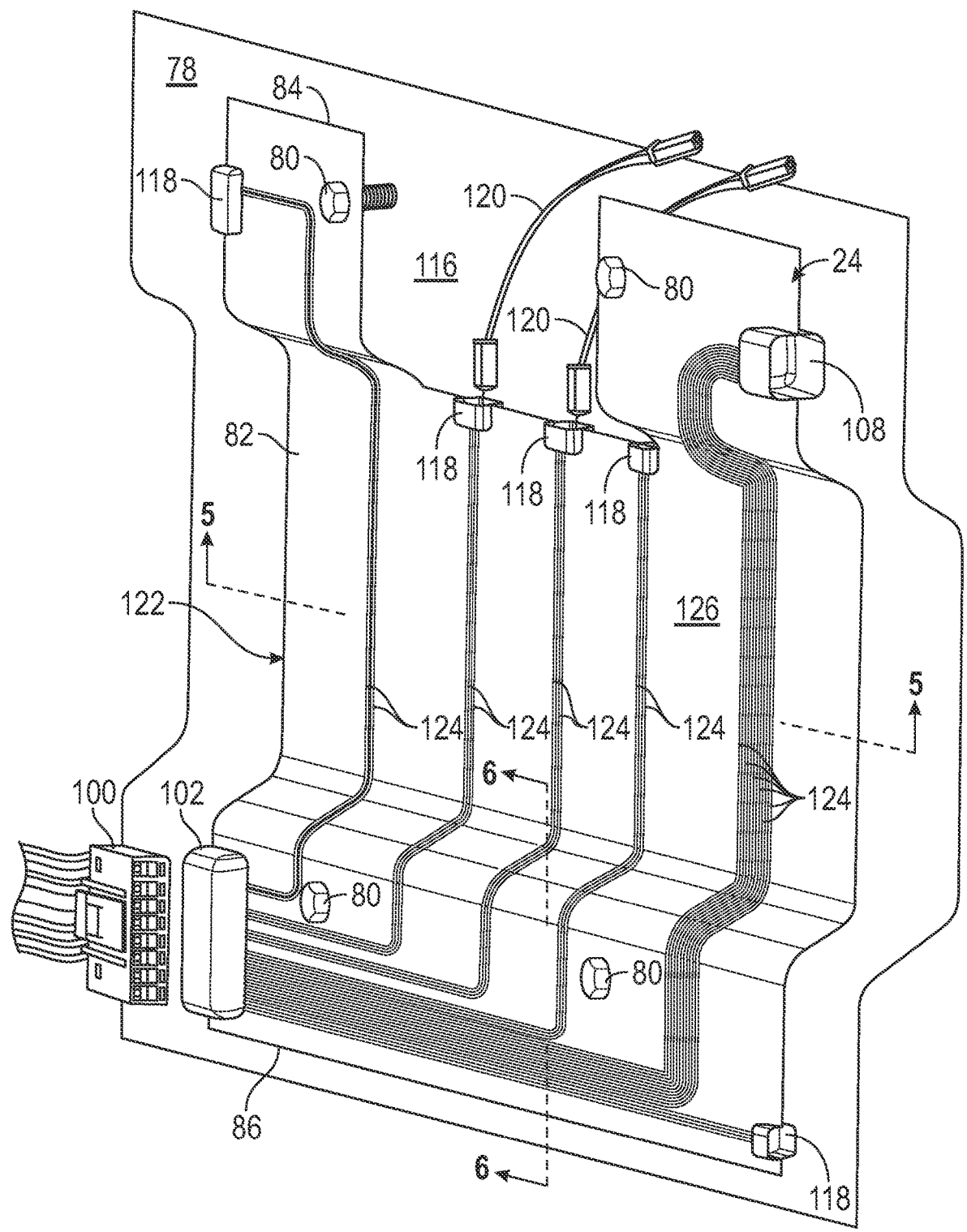
FIG. 2 is an isometric view of an example MWP suitably included in the multi-panel subsystem shown in FIG. 1.

In the illustrated example, and referring also now to FIG. 2, MWP 24 is mounted to work vehicle engine assembly 40 utilizing a number of mechanical fasteners, such as bolts 80 (FIG. 2). As indicated above, the MWP 24 does not have a planar or flat geometry, but is rather imparted with a non-planar 3D shape generally following the outer contour or topology of the non-planar MWP mounting surface 78, a portion of which is illustrated, as a simplified projection, in FIG. 2. Accordingly, the MWP 24 may be molded or otherwise fabricated to generally follow the non-planar contours of the non-planar MWP mounting surface 78, while the MWP 24 may be produced to have a relatively thin-walled, layered construction occupying a relatively small volume of space. In the illustrated example, specifically, the MWP 24 is produced to include a central, depressed portion or valley 82, which extends from opposing outer longitudinal edge portions 84, 86 of the MWP 24 toward the MWP mounting surface 78 and, therefore, into a corresponding recess or cavity provided in the exterior of the work vehicle engine assembly 40. In other embodiments, the MWP 24, and the other MWPs 26, 28, may be imparted with various other 3D geometries conforming to the exterior surfaces or MWP mounting surfaces to which the MWPs 24, 26, 28 are mounted.

The particular mounting locations of the MWPs 24, 26, 28 will vary among embodiments depending upon the exterior geometry of the work vehicle engine assembly 40 (or other component to which the MWPs are mounted) and the location of the integrated electronic devices within the work vehicle engine assembly 40. Two additional example mounting locations at which MWPs 26, 28 may be installed are indicated in FIG. 1 by dashed boxes 88, 90. In certain instances, such as in the case of mounting surfaces 78, 88, a given MWP 24, 26, 28 may span the block-header interface formed between the header assembly 54 and the engine block 52 when the MWP 24, 26, 28 is mounted to the work vehicle engine assembly 40. Stated more generally, the work vehicle engine assembly 40 may include two adjacent or mating components, which are joined at an interface; and one or more of the MWPs 24, 26, 28 may be mounted to the engine assembly 40 at a location spanning (extending over and across) the interface between the adjacent engine components.

Figure 3:
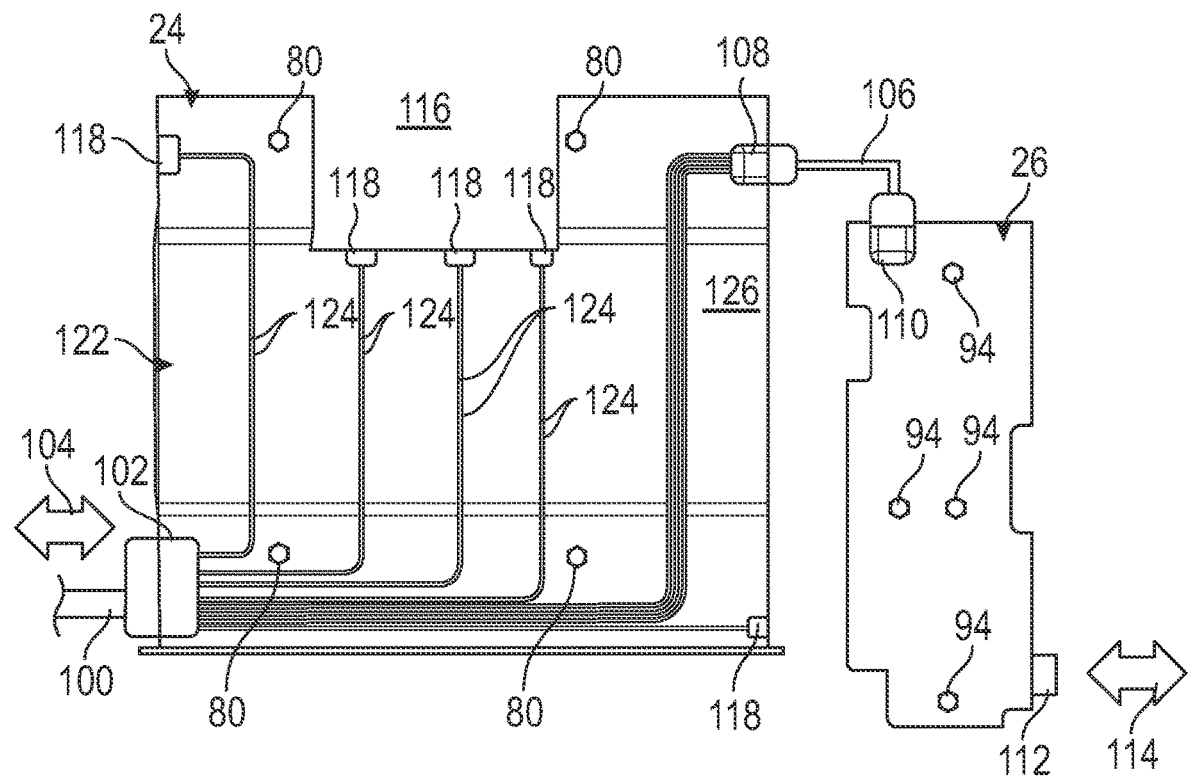
FIG. 3 is a planform view illustrated one manner in which two MWPs included in the multi-panel subsystem shown in FIG. 1 may be interconnected by a connector cable in embodiments.
Figure 4:
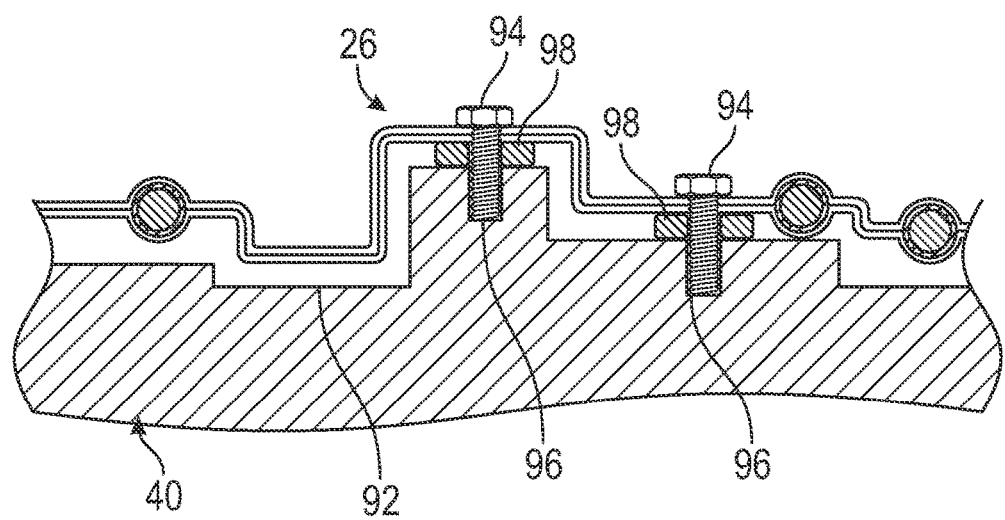
FIG. 4 is a cross-sectional view of one of the MWPs shown in FIG. 3 illustrating an example manner in which the MWP may be attached to an exterior mounting surface of the work vehicle engine (FIG. 1), with the illustrated MWP having a molded three dimensional shape substantially conforming with the non-planar topology of the mounting surface.

The size, shape, and complexity of the MWPs 24, 26, 28 can vary relative to one another, particularly as each MWP is imparted with a design tailored to the unique topology and interconnection requirements corresponding to its underlying mounting area and surrounding regions. In this regard, FIG. 3 further illustrates a front view of the MWP 24 and the MWP 26 in one embodiment. The MWPs 24, 26 are imparted with different geometries, with the 3D shaping of a limited region of the MWP 26 further shown in FIG. 4. Referring jointly to FIGS. 3 and 4, the MWP 26 may likewise be attached to (positioned over or against) a non-planar MWP mounting surface 92 of the work vehicle engine assembly 40 utilizing bolts 94 or similar fasteners. Two such bolts 94 are shown in FIG. 4 and extend through openings provided in the body of the MWP 26, which align with threaded bores or cavities 96 formed in the MWP mounting surface 92. Additionally, elastomeric washers 98 or similar damping elements may be disposed around bolts 94 and captured between the interior surface of the MWP 26 and the exterior surface of the MWP mounting surface 92 (or, more generally, of the work vehicle engine assembly 40) to provide vibration isolation or attenuation; that is, to reduce the vibrational forces transmitted to the MWP 26 during operation of the work vehicle engine assembly 40 to minimize wear between mating components, such as between the below-described ports of MWP 24 and the corresponding connector cables. In other embodiments, spring arms or other damping features may be directly molded into or otherwise integrally formed in the MWP 26 for this purpose. As best shown in FIG. 4, a small standoff or air gap may also be provided between the interior surface of the MWP 26 and the other MWPs 24, 28 and their respective non-planar mounting surfaces for added vibration isolation and/or heat dissipation purposes. Thus, in such embodiments, the MWPs 24, 26, 28 may not directly contact their respective mounting surfaces provided on the engine assembly 40 (or only certain regions of the MWPs 24, 26, 28 may contact the mounting surfaces) due to such a standoff or air gap; e.g., as created via the provision of elastomeric washers 98 or similar standoff features.

The ECU 68 of the combine harvester 20 can be directly electrically coupled to one or more of the MWPs 24, 26, 28 via a cable connector, as represented by the arrow 70 in FIG. 1. An end portion of such a cable connector 100 is shown in FIG. 3 as matingly connected to an input/output (I/O) connector port 102 formed in the MWP 24, which permits signal communication to occur over the MWP 24 (represented by arrow 104). In the illustrated example, the ECU 68 is further coupled to the MWPs 26, 28 through the MWP 24. Accordingly, to permit signal communication between the ECU 68 and the MWP 26 (and, therefore, over MWP 26 to the integrated electronic devices contained in the work vehicle engine assembly 40), a flexible MWP-to-MWP connector cable 106 is provided. The MWP-to-MWP connector cable 106 connects an I/O connector port 108 to a corresponding I/O connector port 110 of the MWP 26, as shown on the right of FIG. 3. A similar flexible connector cable (not shown) may further provide electrical interconnection between an I/O connector port 112 of the MWP 26 and a corresponding I/O connector port provided on the MWP 28 (not shown), as indicated by double-headed arrow 114. Power supply may also be provided through the connector cable 100; through the MWPs 24, 26, 28; and ultimately to the electronic devices integrated into the work vehicle engine assembly 40 and connected to the MWPs 24, 26, 28.

The connections between the MWPs 24, 26, 28 and the integrated electronic devices (that is, the electronic devices 56, 58, 60, 62, 64, 66 discussed above in connection with FIG. 1) can be formed in any suitable manner. For example, in certain embodiments, pin or socket connectors may be molded directly into the respective undersides of the MWPs 24, 26, 28 or otherwise affixed to the MWPs 24, 26, 28, with such pin or socket connectors aligning with the corresponding I/O connectors of the integrated electronic devices when each MWP 24, 26, 28 is installed in its appropriate position against a mounting surface of the work vehicle engine assembly 40 (or other work vehicle component). However, manufacturing tolerance requirements may be eased and a broader applicability of the MWPs 24, 26, 28 may be achieved by providing the connections between the various I/O device connector ports 118 (labeled for the MWP 24 in FIGS. 2 and 3) utilizing flexible cables 120, two of which are partially shown in FIG. 2. These flexible cables 120 may be similar or substantially identical to the flexible cables or wires included in a conventional wiring harness (as may the ECU-to-MWP connector cable 100 and the MWP-to-MWP connector cables 106 shown in FIG. 3), but have a substantially reduced length and complexity. Further, depending upon the distance between the connector ports interconnected utilizing such short cables, such cables may not require separate mounting hardware affixed to the work vehicle engine assembly 40 or may only require a few instances of such mounting hardware. For example, referring to the MPW 24 as an example, the MWP 24 may be dimensioned and otherwise designed such that the I/O device connector ports 118 are placed in close proximity to the corresponding I/O connector ports of the devices integrated into the work vehicle engine assembly 40 such that relatively short cables 120 can be utilized to form the desired interconnections with little to no additional support beyond that provided by insertion of the cable ends into the appropriate connector ports.

The number of layers included in the multilayer panel body 122, and the manner in which such layers are bonded together, will vary between embodiments depending upon the fabrication process utilized to produce the MWP 24. In the illustrated example, the multilayer panel body 122 is formed from at least two dielectric panel layers 128, 130, which are identified in a detail bubble 134 shown on the right of FIG. 5. The panel layers 128, 130 may also be referred to as "laminate layers" in instances in which the multilayer panel body 122 is fabricated using a lamination process, as described below in connection with FIGS. 5-9. As previously indicated, the multilayer panel body 122 is advantageously formed to have a non-planar 3D geometry generally conforming with at least a portion of the non-planar MWP mounting surface 78 over and against which the MWP 24 is installed. For example, as previously indicated and identified in FIG. 2, the MWP 24 may be fabricated to include a depressed or inwardly-bowed central region 82, which may extend into or otherwise generally conform with a depression or cavity provided on the non-planar MWP mounting surface 78. Similarly, the multilayer panel body 122 may be fabricated to include various openings, cut-outs, or notches, such as notch 116, to accommodate various structural features of the work vehicle engine assembly 40, to fine tune the frequency response of the MWP 24, for weight savings, or for other such reasons.

Figure 5:
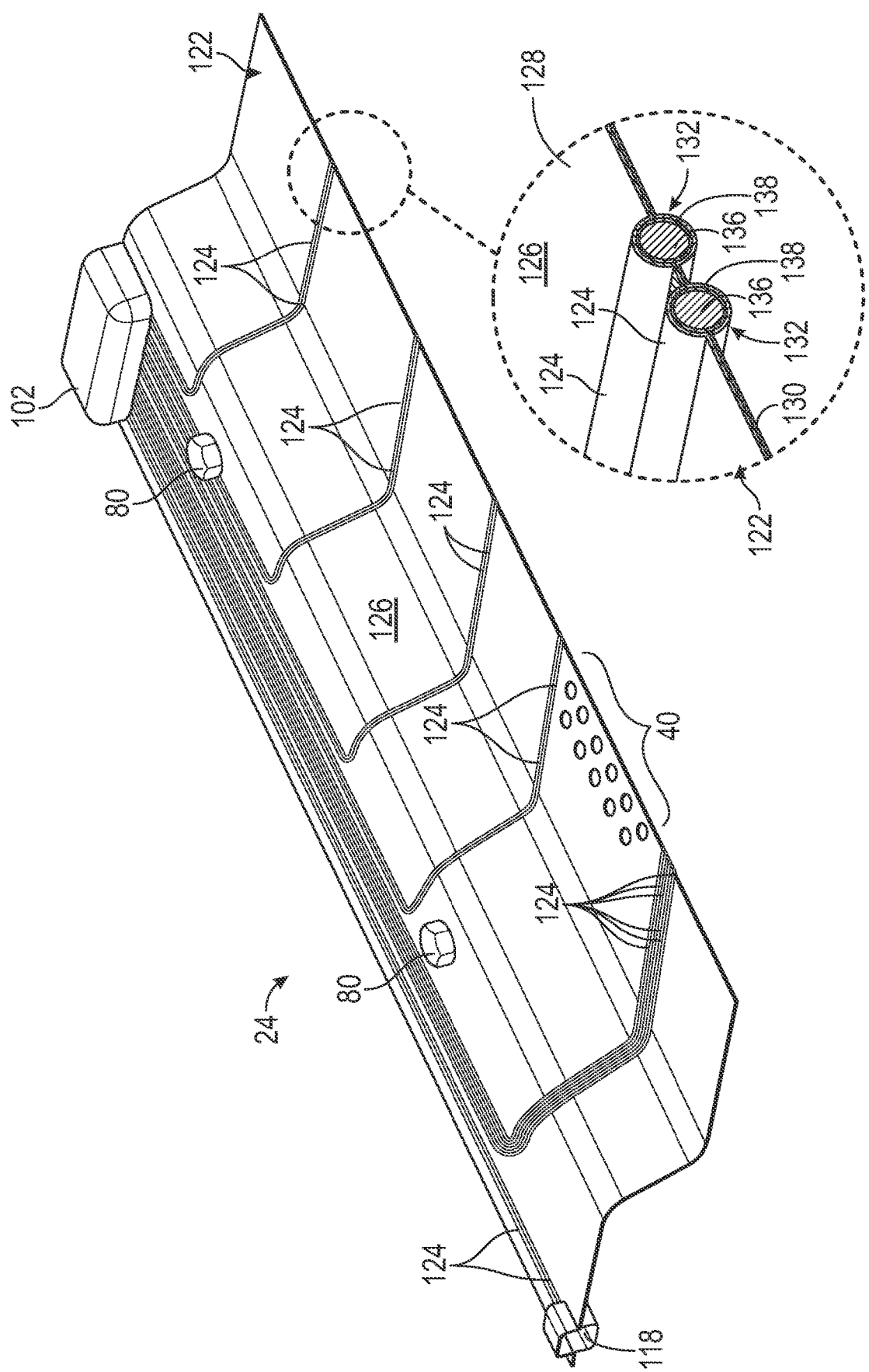
FIG. 5 is a cross-sectional view of the example MWP shown in FIG. 2, as taken along section plane 5-5 in FIGS. 2 and 3, with this drawing figure including a magnification bubble illustrating one region of the example MWP in greater detail.

Similarly, in embodiments, selected portions of the MWP 24 may be fabricated to include openings or perforations, such as perforations or heat release openings 140 shown in FIG. 5, for lightening or heat release purposes. When provided, heat release openings or perforations 140 may be formed through the multilayer panel body 122 at locations corresponding to exterior regions of the work vehicle engine assembly 40 at which elevated temperatures occur during work vehicle engine operation.

The MWP 24 contains a multilayer panel body 122 in which a number of preplaced wires 132 are embedded. Due to the manner in which the multilayer panel body 122 is produced, raises features or bulges 124 (hereafter, "wire tunnel protrusions 124") are created in the panel body 122, with the preplaced wires 132 running or extending within the wire tunnel protrusions 124. Such wire tunnel protrusions 124 may be formed in the exterior or outboard surface 126 of the MWP 24 (that is, the principal surface of the MWP 24 facing outwardly away from the MWP mounting surface 78), the interior or inboard surface of the MWP 24 (that is, the principal surface of the MWP 24 facing inwardly toward from the MWP mounting surface 78), or both. The preplaced wires 132 are embedded in the multilayer panel body 122 and electrically interconnect the panel input/output (I/O) interfaces of the MWP 24. In the illustrated embodiment, the panel I/O interfaces include the connector ports 102, 108, 118, as previously described.

As shown most clearly in the detail bubble 134, the preplaced wires 132 embedded within the multilayer panel body 122 (here, captured between the panel layers 128, 130) can be single stranded conductors in embodiments. The preplaced wires 132 may include an electrically-conductive core 136, which may be surrounded by a tubular layer 138 in embodiments. When provided, the outer tubular layer 138 may be a metal cladding. In other embodiments, the outer tubular layer 138 may be a dielectric sheathing in certain embodiments; however, this is generally unnecessary when a single wire runs within each wire tunnel protuberance 124 (or when multi-stranded wires that carry a common electrical signal run within each wire tunnel protuberance 124) given the dielectric composition of the multilayer panel body 122. In other instances, the preplaced wires 132 may lack such an outer tubular layer 138 or cladding. In one approach, bare or non-insulated wires (whether clad or non-clad) are embedded in the multilayer panel body 122 and extend within the various wire tunnel protrusions 124, with the panel layers 128, 130 providing the requisite electrical insulation and position holding between the wires 132. The discrete, preplaced wires 132 embedded within the multilayer panel body 122 may each have a circular cross-section shape and a wire diameter equal to or greater than 1 mm in embodiments; and/or a gauge ranging from about 18 to about 12 AWG. Finally, while two bare wires 132 are shown in FIGS. 1-3 and 5 are extending to each of the I/O device connector ports 118, it will be appreciated that any practical number of wires 132 may be routed to each port 118, as needed for power supply and interconnection with the particular integrated electronic device corresponding to the port 118. For example, in embodiments, in which a particular integrated electronic device is a three terminal or four terminal device, three or four wires may be routed to the corresponding I/O device connector port 118 through the multilayer panel body 122.

While focusing on MWP 24, the foregoing description is equally applicable to the other MWPs 26, 28 included in multi-panel subsystem 30 (FIG. 1). The multi-panel subsystem 30 thus facilitates formation of the desired electrical connections between the ECU 68, the power supply 72, and the various electronic devices 56, 58, 60, 62, 64, 66 integrated into the work vehicle engine assembly 40, while eliminating or at least reducing dependency on complex wiring harness arrangements. This, in turn, helps simplify the wiring architecture of the work vehicle engine assembly 40, while improving the overall reliability of the engine assembly 40. Further, repair and maintenance are streamlined by allowing the replacement of a single MWP 24, 26, 28 or a subset of the MWPs included in the multi-panel subsystem 30, as appropriate. Further, the above-described MWP 24, 26, 28 are amenable to fabrication utilizing relative straightforward and cost efficient manufacturing processes, while incorporating preplaced wires similar to, if not identical to commercially-available wires of the type traditionally incorporated into wiring harnesses within existing work vehicle platforms. Examples of manufacturing processes suitable for fabricating MWPs will now be discussed in connection with FIGS. 6-9. For consistency, the following example manufacturing processes will be described in connection with the production of the MWP 24 shown in FIGS. 1-3 and 5, with a region of the MWP 24 corresponding to section plane 6-6 (FIG. 2) illustrated in FIGS. 6-9 at various stages of fabrication. This notwithstanding, the following description applies equally to the production of the MWPs 26, 28 or the production of various other MWPs that may differ in various respects as compared to the example MWPs 24, 26, 28 described above.

Example Methods for Fabricating Multilayer Wiring Panels

FIGS. 6-9 illustrate, in a step-by-step sequence, an example method for manufacturing MWP suitable for usage within work vehicle systems, such as a work vehicle engine system (e.g., work vehicle engine system 22) or another work vehicle engine system having a relatively dense wiring interconnection architecture. For the purpose of illustration, the following will describe the example manufacturing methods as utilized to produce MWP 24 described above in connection with FIGS. 1-5, with reference numerals carried forward as appropriate. A prime symbol (') is appended to reference numeral "24" in describing the MWP 24 below to denote that the MWP 24' is shown at various stages of completion in FIGS. 6-9.

Figure 6:
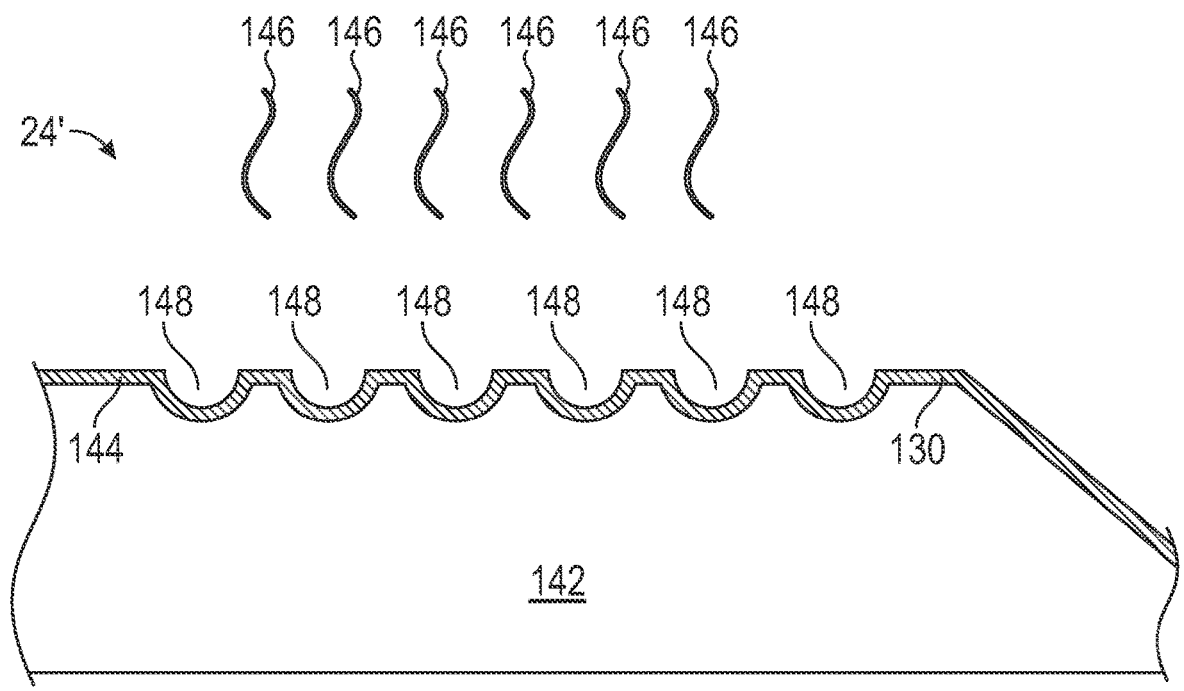
FIGS. 6-9 are cross-sectional views of the example MWP shown in FIGS. 2, 3, and 5, as taken along section plane 6-6 in FIG. 2, and depicting the MWP at various stages of manufacture when fabricated in accordance with example manufacturing processes.

Referring to FIG. 6, the panel layer 130 of the partially-fabricated MWP 24' (hereafter, the "base panel layer 130") is initially formed into a desired 3D shape corresponding to the topology of the non-planar MWP mounting surface 78 (FIG. 1). In embodiments, the base panel layer 130 may be fabricated from a moldable, thermosetting polymer sheet, which is formed into the desired shape by heating and pressing against a suitable die or fixture 142 having an upper surface 144 with the desired topology. Such a sheet may be initially cut to size or trimmed following the shaping process. Suitable materials from which a thermosetting or laminate sheet may be fabricated include PDCPD, acetal, polysulfone, polyimide-based plastics, and polypropylene, which may include fillers (e.g., carbon fibers) in certain instances for added strength or property enhancements. The application of heat utilized to form the sheet into the desired 3D shape is indicated by heat lines 146 in FIG. 6, noting that the fixture 142 may itself be heated in some instances and various heating schedules may be followed. Further, a partial vacuum may be drawn through the fixture 142 and act on the underside of the sheet to urge the sheet to fully conform against the upper surface 144 of the fixture 142 in embodiments in which a vacuum forming approach is utilized. Notably, the base panel layer 130 is formed to include open cavities, trenches, or recesses 148 for reception of the preplaced wires 132. Accordingly, the open wire cavities are formed to have dimensions permitting the registration or mating reception of the replaced wires 132. The desired wiring layout is thus pre-formed in the upper surface 144 of the fixture 142 in the illustrated example. As a more specific example, at the upper portion of the fixture 142 may be produced via an additive manufacturing process or utilizing a material removal process, such as by machining the desired furrows defining the wiring layout and the other topological features into the upper support surface (e.g., by machining a ceramic block or similar substrate).

In further implementations, the base panel layer 130 may be formed utilizing another process. For example, a conformal deposition process can be utilized to form the base panel layer 130 over the upper surface 144 of the fixture 142, noting that the base panel layer 130 may be formed to have a substantially uniform thickness in embodiments and to conform with the upper surface 144. Thus, in this case and in the above-described approach in which a laminate sheet is formed against the upper surface 144 of the fixture 142, the predetermined wiring pattern or wiring cavity layout is effectively transferred form the upper surface 144 to the base panel layer 130. In still other embodiments, a 3D printing process, such as stereolithography, or another additive manufacturing process may be utilized to produce the base panel layer 130 in accordance with a predetermined computer-readable design file. In this latter case, the base panel layer 130 may be additively manufactured or printed to the designed shape, including the desired wiring cavity pattern, without the need for a specialized fixture. Various other fabrication techniques also be utilized to produce the base panel layer 130 in embodiments, including injection and transfer molding; however, the above-described fabrication techniques are generally beneficial in providing a relatively cost effective and streamlined manner in which the base panel layer 130 (and the other MWP components) can be fabricated.

Figure 7:
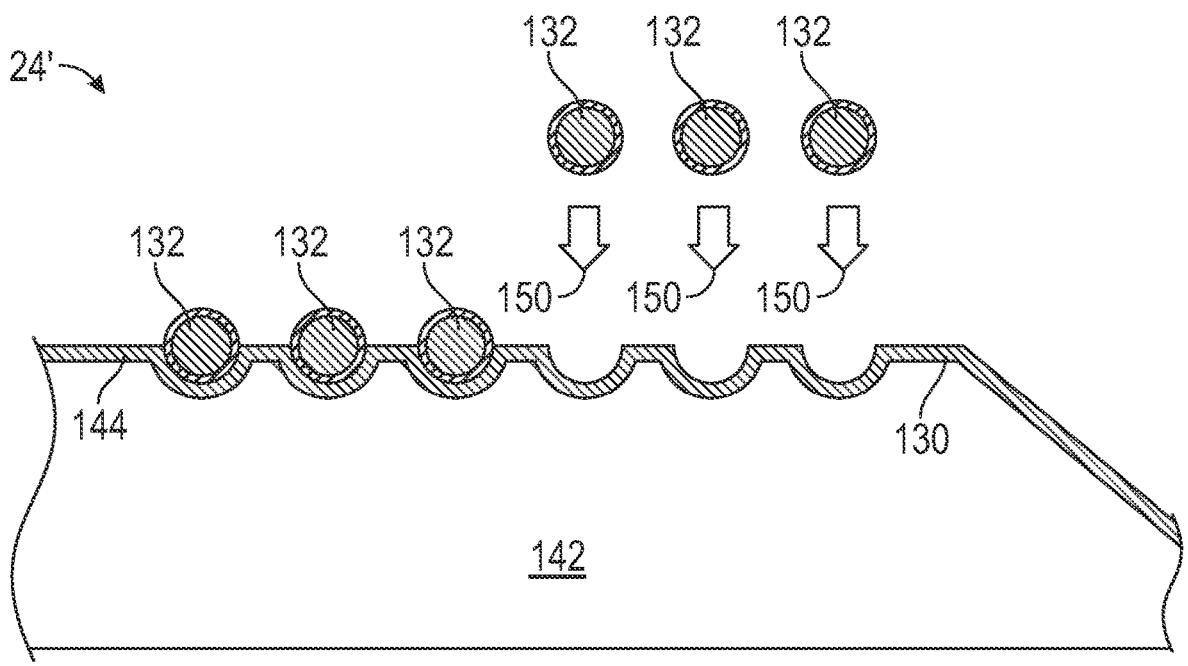

Progressing to FIG. 7, discrete lengths of wires are next inserted into the previously-defined wire cavities 148 (FIG. 6) to provide the preplaced wires 132, as indicated by arrows 150. The preplaced wires 132 may be manually positioned in the cavities 148 by a technician in embodiments; or, instead, positioning of the preplaced wires 132 may be automated utilizing a computer-controlled tool. In some instances, adhesive may be applied to help retain wires 132 in their desired positions through the remainder of the manufacture process; while, in other instances, such adhesive may not be utilized. Again, the preplaced wires 132 are illustrated in FIG. 7 as having outer tubular layers 138 surrounding inner cores 136 (identified in FIG. 5) to denote that the wires 132 may be composed of core having a first metallic composition clad with an outer layer having a second metallic composition. In other embodiments, the wires 132 may not be clad and may instead having a substantially uniform metallic composition through their thickness. The wires 132 may or may not be insulated by an outer dielectric sheathing; although, as previously noted, a benefit of the MWP construction is the ability to inherently provide electrical isolation between neighboring wires via the spacing and dielectric properties provided by the multilayer panel body 122 (FIG. 5). Thus, as indicated in FIG. 7, bare wires may be inserted into the previously-defined wire cavities 148 during this stage of manufacture in embodiments. Such wires may terminate in non-illustrated connectors, which are further embedded in the multilayer panel body 122 at locations corresponding to the above-described ports 102, 108, 118.

Figure 8:
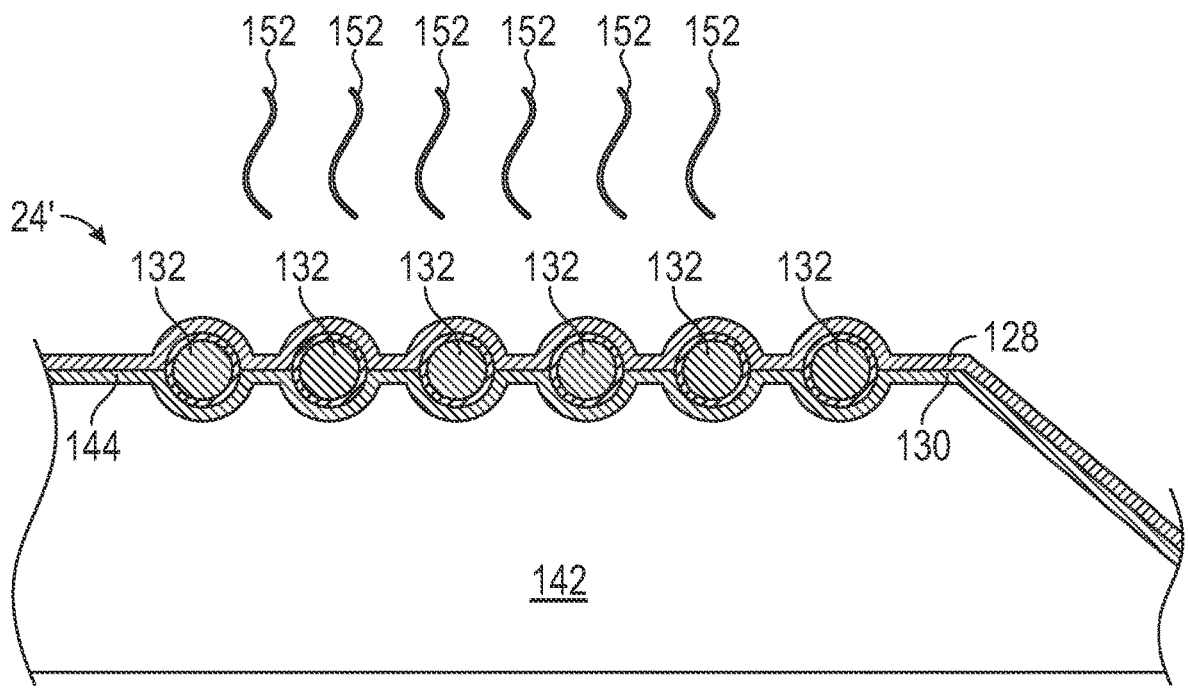

Next, the multilayer panel body 122 is formed, capturing the preplaced wires 132 between the layers 128, 130 of the panel body 122, as indicated in FIG. 8. Here, the panel layer 128 (hereafter, the "cover panel layer 128") is bonded over the base panel layer 130 and encloses the preplaced wires 132 within their respective cavities. The various processes described above in connection with formation of the base panel layer 130 and generally equally applicable to the formation of the cover panel layer 128, as are the dielectric materials previously mentioned as potentially composing the base panel layer 130. In one useful approach, and as indicated in FIG. 8 by heat lines 152, a lamination process is utilized in which a thermosetting polymer sheet is heated and pressed against the base panel layer 130 and the preplaced wires 132 to form a bond joining the sheets to the base panel layer 130. This forms the cover panel layer 128 upon cooling and setting of the newly-formed laminate sheet. Such an approach may be particularly useful when the base panel layer 130 is initially formed by molding a thermosetting sheet to conform with the topology of the upper surface 144 of the fixture 142, and thereby transfer the wiring cavity pattern to the resulting base panel layer 130, as previously described. This may allow the same fixture to be utilized for subsequent wire placement (FIG. 7), as well as for formation and bonding of the cover panel layer 128 via lamination of a thermosetting sheet composed of the same or similar material as is the base panel layer 130. Further, through the application of heat and pressure, a relatively robust bond can be created across the interface between the laminated sheets (here, the layers 128, 130), noting that a relatively expansive surface area is provided for such bond. In still other embodiments, one or more intervening layers of material may be disposed between the layers 128, 130 to enhance bonding or to enhance another property (e.g., the strength) of the MWP 24'.

Figure 9:
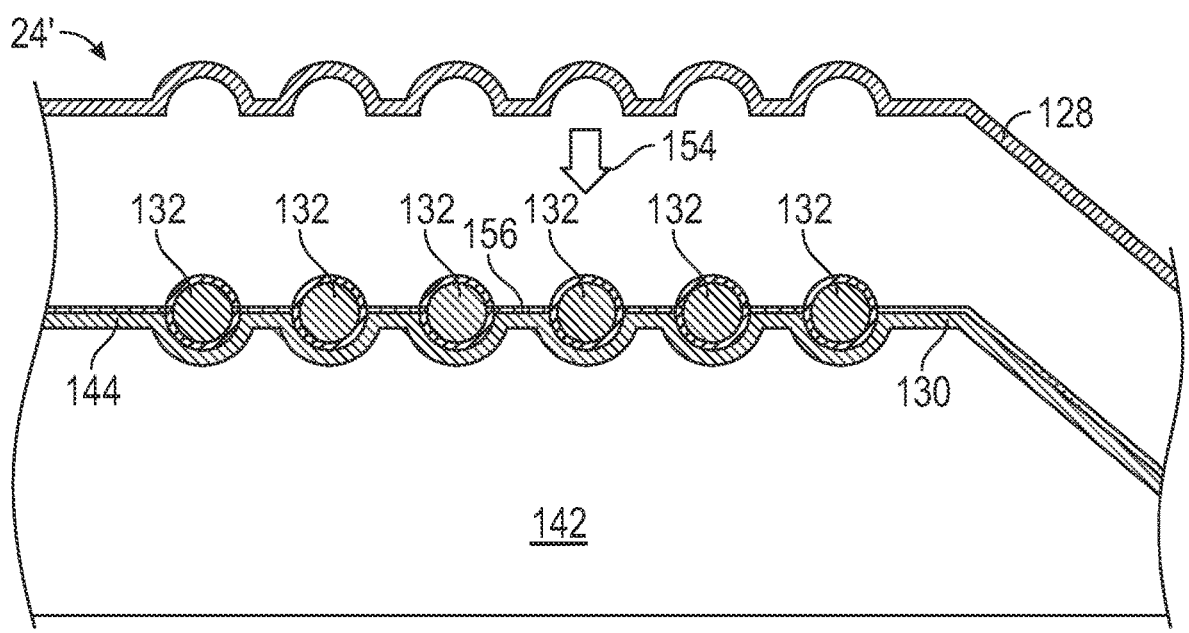

In still other embodiments, the cover panel layer 128 may be formed over the base panel layer 130 and the preplaced wires 132 by conformal deposition, by additive manufacture, or utilizing a similar process. As indicated in FIG. 8, when imparted with a substantially uniform thickness, the cover panel layer 128 may likewise form localized bulges or protrusions accommodating the preplaced wires 132, as shown. Additionally, the above-described processes (in which the cover panel layer 128 is formed against the base panel layer 130 and the preplaced wires 132) further impart the desired 3D topology to the cover panel layer 128, as may be appreciated by referring to the right side of FIG. 8 and noting the downward curvature of the MWP 24 corresponding to the depressed central region 82 of the MWP 24 shown in FIGS. 1, 2, 4, and 5. In still other instances, the upper cover panel layer 128 may be separately formed (e.g., by additive manufacture, by molding, or by (e.g., vacuum) forming against a fixture similar to the fixture 142) and then bonded in place over the base panel layer 130 and the preplaced wires 132. This possibility is indicated in FIG. 9, with an arrow 154 indicating the manner in which the cover panel layer 128 (here, separately produced) may be brought into contact and urged against a bonding layer 156 (e.g., a layer of pressure sensitive adhesive or thermally-curable epoxy), as after deposition of the bond layer 156 over the mating surface of the base panel layer 130 and, perhaps, over the preplaced wires 132. Regardless of the particular formation and bonding approach utilized in conjunction with the cover panel layer 128, additional process steps may then be performed to complete fabrication of the MWP 24'. Such additional process steps may include termination of any of the preplaced wires 132 if such wires 132 do not already terminate in the desired I/O connector interfaces. Additionally, if not already formed, material removal processes (e.g., laser cutting, punching, or the like) may be utilized to create the more refined features of the MWP 24, such as fastener openings accommodating the bolts 80 (FIGS. 2-5) and the heat release perforations 140 (FIG. 5), if provided.

Enumerated Examples of Work Vehicle Systems Including Multilayer Wiring Panels

The following examples of the work vehicle systems included multilayer wiring panels are further provided and numbered for ease of reference.

1. In embodiments, a work vehicle system includes a controller, a work vehicle component, and a first MWP. The work vehicle component includes, in turn, a component housing having a non-planar mounting surface, as well as a first integrated electronic device at least partially contained in the component housing. The first MWP is mounted to the work vehicle component and positioned over the non-planar mounting surface. The first MWP contains a multilayer panel body having a non-planar cross-sectional shape generally conformal with a topology of the non-planar mounting surface, preplaced wires embedded in the multilayer panel body, and panel I/O interfaces electrically connected by the preplaced wires. The panel I/O interfaces include first and second panel I/O interfaces electrically coupled to the controller and to the first integrated electronic device, respectively, such that the controller is placed in signal communication with the first integrated electronic device through the first MWP during operation of the work vehicle system.

2. The work vehicle system of example 1, further including a work vehicle power source further electrically coupled to the first integrated electronic device through the first MWP.

3. The work vehicle system of example 1, further including a second MWP mounted to the work vehicle component at a location spaced from the first MWP. Additionally, a second integrated electronic device is contained in the component housing, located adjacent the second MWP, and electrically coupled to the controller through the first MWP and through the second MWP.

4. The work vehicle system of example 3, further including a flexible connector cable electrically coupling the first MWP to the second MWP. The panel I/O interfaces include a third I/O interface in the form of a connector port into which a connector end of the flexible connector cable is matingly received.

5. The work vehicle system of example 1, wherein work vehicle component includes a work vehicle engine assembly, while the controller includes an ECU electrically coupled to the work vehicle engine assembly through the first MWP.

6. The work vehicle system of example 5, wherein the first MWP is mounted to the work vehicle engine assembly at a location spanning the interface between adjacent components of the work vehicle engine assembly.

7. The work vehicle system of example 5, wherein the first integrated electronic comprises a sensor or an actuator contained in a subsystem of the work vehicle engine assembly.

8. The work vehicle system of example 1, wherein the preplaced wires include lengths of wires each having generally circular cross-sectional shape and a diameter exceeding about 1 millimeter.

9. The work vehicle system of example 8, wherein the preplaced wires include bare conductors embedded within the multilayer panel body, while wherein the multilayer panel body provides position holding and electrical insulation between the preplaced wires embedded therein.

10. The work vehicle system of example 1, wherein the multilayer panel body includes a first dielectric laminate layer and a second dielectric laminate layer bonded to the first dielectric laminate layer. The preplaced wires are captured between the first dielectric laminate layer and the second dielectric laminate layer.

11. The work vehicle system of example 10, wherein the first dielectric laminate layer and the second dielectric laminate layer are each composed of a thermosetting polymer material.

12. The work vehicle system of example 1, wherein the work vehicle component includes a work vehicle engine assembly. The first MWP further includes heat release openings formed through the multilayer panel body at locations corresponding to exterior regions of the work vehicle engine assembly at which elevated temperatures occur during work vehicle engine operation.

13. The work vehicle system of example 1, wherein the first MWP further includes fastener openings formed through the multilayer panel body. The work vehicle system further includes fasteners extending through the fastener openings and into the non-planar mounting surface to affix the first MWP to the work vehicle component, while providing an air gap between an interior surface of the first MWP and the non-planar mounting surface.

14. The work vehicle system of example 1, wherein the multilayer panel body is shaped to have a cavity into which a protruding feature of the work vehicle component projects when the first MWP is mounted to the work vehicle component and positioned over the non-planar mounting surface.

15. The work vehicle system of example 1, further a second integrated electronic device contained in the component housing. The first integrated electronic device includes a sensor configured to generate sensor output signals transmitted to the controller through the first MWP, while the second integrated electronic device includes an actuator configured to receive command signals from the controller routed through the first MWP.

Conclusion

There has been provided work vehicle systems include MWPs, which streamline interconnections between a controller, a power source, and integrated electronic devices contained within a work vehicle component. A given MWP may be include a multilayer panel body, which fabricated to have a non-planar cross-sectional shape generally conformal with a non-planar topology of a mounting surface to which the MWP is attached. The MWP may further contain preplaced wires, which are embedded within the multilayer panel body and electrically interconnect the panel I/O interfaces (e.g., connector ports). The preplaced wires may be provided as bare or non-insulated wires (e.g., single stranded conductors, clad or non-clad) in embodiments, as insulated wires, or a combination thereof. It is also possible for cables containing multiple electrically-isolated wires to be embedded within the multilayer panel body in some instances, such as to interconnected the panel-to-panel I/O interfaces of a given MWP; however, manufacture may be simplified in embodiments by principally or exclusively embedding bare conductors within the multilayer panel body and leveraging the panel body for electrical insulation and position holding purposes. The multilayer panel body may be composed of dielectric materials well-suited for usage in high temperature, high vibration environments when, for example, the MWP is mounted to an exterior surface of a work vehicle engine assembly. Further, the multilayer panel body can be fabricated to have a relatively thin form factor providing space savings, while simplifying mounting to the work vehicle component. In embodiments, two or more MWPs may be mounted to an engine assembly (or other work vehicle component) and electrically interconnected to form a multi-panel subsystem. In embodiments, such MWPs may be interconnected with each other, with a controller (e.g., an ECU), and the externally-accessible device terminals of the integrated electronic devices utilizing connector cables with standardized connector ends. In this manner, reliance complex wiring harness routing schemes can be avoided, while facilitating the rapid replacement of any given MWP for repair or maintenance purposes.

Finally, as used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. Explicitly referenced embodiments herein were chosen and described in order to best explain the principles of the disclosure and their practical application, and to enable others of ordinary skill in the art to understand the disclosure and recognize many alternatives, modifications, and variations on the described example(s). Accordingly, various embodiments and implementations other than those explicitly described are within the scope of the following claims.

What is claimed is:

1. A work vehicle system, comprising:
a controller;
a work vehicle component, comprising:
　a component housing having a non-planar mounting surface; and
　a first integrated electronic device at least partially contained in the component housing;
a first multilayer wiring panel (MWP) mounted to the work vehicle component and positioned over the non-planar mounting surface, the first MWP comprising:
　a multilayer panel body having a non-planar cross-sectional shape generally conformal with a topology of the non-planar mounting surface;
　preplaced wires embedded in the multilayer panel body; and
　panel input/output (I/O) interfaces electrically connected by the preplaced wires, the panel I/O interfaces comprising first and second panel I/O interfaces electrically coupled to the controller and to the first integrated electronic device, respectively, such that the controller is placed in signal communication with the first integrated electronic device through the first MWP during operation of the work vehicle system;
a second MWP mounted to the work vehicle component at a location spaced from the first MWP; and
a second integrated electronic device contained in the component housing, located adjacent the second MWP, and electrically coupled to the controller through the first MWP and through the second MWP.

2. The work vehicle system of claim 1, further comprising a work vehicle power source further electrically coupled to the first integrated electronic device through the first MWP.

3. The work vehicle system of claim 1, further comprising a flexible connector cable electrically coupling the first MWP to the second MWP; and
　wherein the panel I/O interfaces include a third I/O interface comprising a connector port into which a connector end of the flexible connector cable is matingly received.

4. A work vehicle system, comprising:
a controller;
a work vehicle component, comprising:
　a component housing having a non-planar mounting surface; and
　a first integrated electronic device at least partially contained in the component housing; and
a first multilayer wiring panel (MWP) mounted to the work vehicle component and positioned over the non-planar mounting surface, the first MWP comprising:
　a multilayer panel body having a non-planar cross-sectional shape generally conformal with a topology of the non-planar mounting surface;
　preplaced wires embedded in the multilayer panel body; and
　panel input/output (I/O) interfaces electrically connected by the preplaced wires, the panel I/O interfaces comprising first and second panel I/O interfaces electrically coupled to the controller and to the first integrated electronic device, respectively, such that the controller is placed in signal communication with the first integrated electronic device through the first MWP during operation of the work vehicle system;
wherein the work vehicle component comprises a work vehicle engine assembly; and
wherein the controller comprises an engine control unit (ECU) electrically coupled to the work vehicle engine assembly through the first MWP.

5. The work vehicle system of claim 4, wherein the first MWP is mounted to the work vehicle engine assembly at a location spanning the interface between adjacent components of the work vehicle engine assembly.

6. The work vehicle system of claim 4, wherein the first MWP comprises a sensor or an actuator contained in a subsystem of the work vehicle engine assembly.

7. The work vehicle system of claim 1, wherein the preplaced wires comprise lengths of wires each having generally circular cross-sectional shape and a diameter exceeding about 1 millimeter.

8. The work vehicle system of claim 7, wherein the preplaced wires comprise bare conductors embedded within the multilayer panel body; and
　wherein the multilayer panel body provides position holding and electrical insulation between the preplaced wires embedded therein.

9. The work vehicle system of claim 1, wherein the multilayer panel body comprises:
   a first dielectric laminate layer; and
   a second dielectric laminate layer bonded to the first dielectric laminate layer, the preplaced wires captured between the first dielectric laminate layer and the second dielectric laminate layer.

10. The work vehicle system of claim 9, wherein the first dielectric laminate layer and the second dielectric laminate layer are each composed of a thermosetting polymer material.

11. The work vehicle system of claim 1, wherein the work vehicle component comprises a work vehicle engine assembly; and
   wherein the first MWP further comprises heat release openings formed through the multilayer panel body at locations corresponding to exterior regions of the work vehicle engine assembly at which elevated temperatures occur during work vehicle engine operation.

12. A work vehicle system, comprising:
   a controller;
   a work vehicle component, comprising:
      a component housing having a non-planar mounting surface; and
      a first integrated electronic device at least partially contained in the component housing; and
   a first multilayer wiring panel (MWP) mounted to the work vehicle component and positioned over the non-planar mounting surface, the first MWP comprising:
      a multilayer panel body having a non-planar cross-sectional shape generally conformal with a topology of the non-planar mounting surface;
      preplaced wires embedded in the multilayer panel body; and
      panel input/output (I/O) interfaces electrically connected by the preplaced wires, the panel I/O interfaces comprising first and second panel I/O interfaces electrically coupled to the controller and to the first integrated electronic device, respectively, such that the controller is placed in signal communication with the first integrated electronic device through the first MWP during operation of the work vehicle system;
   wherein the first MWP further comprises fastener openings formed through the multilayer panel body; and
   wherein the work vehicle system further comprises fasteners extending through the fastener openings and into the non-planar mounting surface to affix the first MWP to the work vehicle component, while providing an air gap between an interior surface of the first MWP and the non-planar mounting surface.

13. The work vehicle system of claim 1, wherein the multilayer panel body is shaped to have a cavity into which a protruding feature of the work vehicle component projects when the first MWP is mounted to the work vehicle component and positioned over the non-planar mounting surface.

14. The work vehicle system of claim 1, further comprising a second integrated electronic device contained in the component housing, wherein the first integrated electronic device comprises a sensor configured to generate sensor output signals transmitted to the controller through the first MWP; and
   wherein the second integrated electronic device comprises an actuator configured to receive command signals from the controller routed through the first MWP.

15. A multilayer wiring panel (MWP) installable within a work vehicle system including a controller and a work vehicle engine assembly containing an integrated electronic device, the MWP comprising:
   a multilayer panel body configured to be mounted to a non-planar mounting surface of the work vehicle engine assembly when the MWP is installed within the work vehicle system, the multilayer panel body having a non-planar cross-sectional shape generally conformal with a topology of the non-planar mounting surface;
   preplaced wires embedded in the multilayer panel body;
   panel input/output (I/O) interfaces electrically interconnected by the preplaced wires, the panel I/O interfaces comprising first and second panel I/O interfaces configured to be electrically coupled to the controller and to the integrated electronic device, respectively, to place the controller in signal communication with the integrated electronic device through the preplaced wires when the MWP is installed within the work vehicle system; and
   heat release openings formed through the multilayer panel body at locations corresponding to exterior regions of the work vehicle engine assembly at which elevated temperatures occur during work vehicle engine operation.

16. The MWP of claim 15, wherein the preplaced wires comprise lengths of wires each having generally circular cross-sectional shape and a diameter exceeding about 1 millimeter.

17. The MWP of claim 15, wherein the preplaced wires comprise bare conductors embedded within the multilayer panel body; and
   wherein the multilayer panel body provides position holding and electrical insulation between the preplaced wires embedded therein.

18. The MWP of claim 15, wherein the multilayer panel body comprises:
   a first dielectric laminate layer; and
   a second dielectric laminate layer bonded to the first dielectric laminate layer, the preplaced wires captured between the first dielectric laminate layer and the second dielectric laminate layer;
   wherein the first dielectric laminate layer and the second dielectric laminate layer are each composed of a thermosetting polymer material.

19. The MWP of claim 15, wherein the multilayer panel body comprises:
   a base panel layer formed to have preplaced wire cavities into which the preplaced wires are inserted; and
   a cover panel layer bonded over the base panel layer and the preplace wires.

* * * * *